United States Patent [19]

Sasaki

[11] Patent Number: 4,521,448
[45] Date of Patent: Jun. 4, 1985

[54] METHOD OF MANUFACTURING SEMICONDUCTOR DEVICE

[75] Inventor: Yoshitaka Sasaki, Yokohama, Japan

[73] Assignee: Tokyo Shibaura Denki Kabushiki Kaisha, Japan

[21] Appl. No.: 471,651

[22] Filed: Mar. 3, 1983

[30] Foreign Application Priority Data

Mar. 16, 1982 [JP] Japan .................... 57-41331

[51] Int. Cl.³ .......................... H01L 21/283
[52] U.S. Cl. ...................... 427/88; 156/643; 156/653; 156/657; 427/93; 427/259
[58] Field of Search .......... 427/86, 93, 88, 259; 156/643, 653, 657

[56] References Cited

U.S. PATENT DOCUMENTS 4,354,896 10/1982 Hunter .................... 427/86
4,359,816 11/1982 Abbas .................... 29/591

OTHER PUBLICATIONS

Shinji Okazaki et al., "Edge-Defined Patterning of Hyperfine Refractory Metal Silicide MOS Structures", IEEE Transactions on Electron Devices, vol. ED-28, No. 11, 11/81, pp. 1364–1368.
Hideo Sunami et al., "Selective Oxide Coating of Silicon Gate (SELOCS)", Japanese Journal of Applied Physics, vol. 18, (1979), Supplement 18-1, pp. 255–260.

Primary Examiner—John D. Smith
Attorney, Agent, or Firm—Finnegan, Henderson, Farabow, Garrett & Dunner

[57] ABSTRACT

A method of manufacturing a semiconductor device comprises the steps of: forming a thin film on a semiconductor body on which a protruding pattern is formed with the film covering both the sides and the top of the protruding pattern; performing a selective anisotropic etching on the thin film for a distance corresponding to the thin film thickness, thereby removing a portion of the thin film including that portion covering the top of the protruding pattern and leaving a portion of the thin film covering the sides of the protruding pattern, thus forming a thin film pattern surrounding at least a portion of the protruding pattern; etching at least a top part of the protruding pattern while leaving the thin film pattern to extend upwardly from the surface of the semiconductor body; forming a conductive material film covering the semiconductor body including the thin film pattern; and dividing the conductive material film into portions by removing the thin film pattern.

26 Claims, 29 Drawing Figures

F I G. 1L
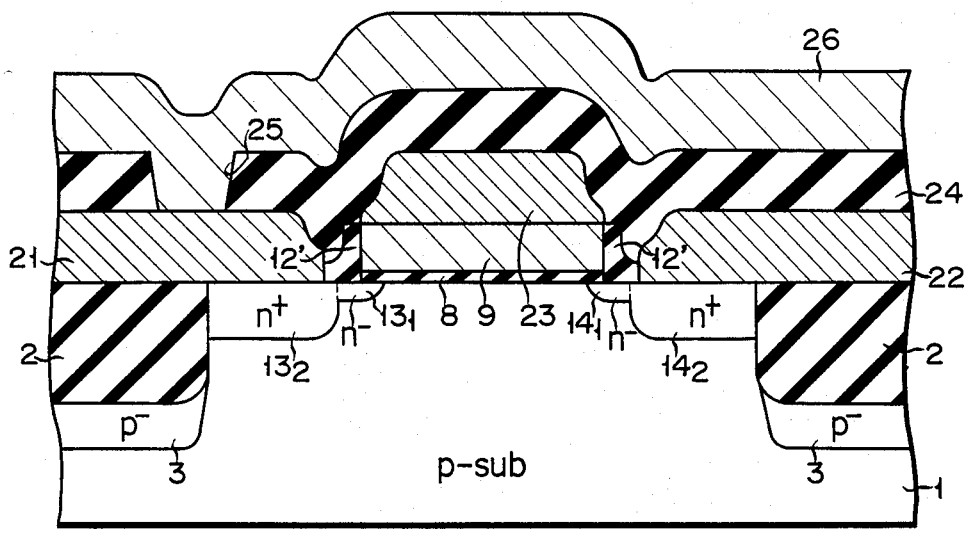
F I G. 2
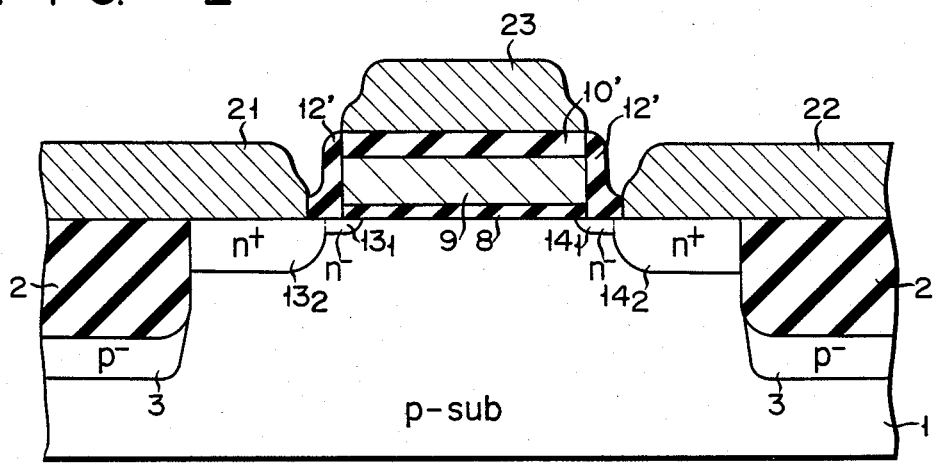

METHOD OF MANUFACTURING SEMICONDUCTOR DEVICE

BACKGROUND OF THE INVENTION

The present invention relates to a method of manufacturing a semiconductor device and, more particularly, to a method of manufacturing a semiconductor device which has a step for forming electrodes and wiring strips, using self-aligned contact holes.

Recent advances in techniques for manufacturing semiconductor devices and particularly semiconductor integrated circuits are significant. Improvements are particularly seen in photolithography, ion implantation, dry etching and so on. However, even if elements are micronized by these techniques, the packaging density is limited due to various restrictions in forming contact holes, positioning margin and in the like process.

In view of this, a self-aligned contact (S.A.C.) technique is known as a method for forming a contact hole in self-alignment with a gate electrode in the manufacture of a MOS transistor. Such S.A.C. technique entitled as SELOCS (selective oxide coating of silicon gates) is published by HIDEO SUNAMI in Japanese Journal of Applied Physics, Vol. 18 (1979), pp. 255 to 260. According to this technique, a phosphorus-doped polycrystalline silicon (polysilicon) pattern having a high impurity concentration is formed on a gate oxide film which is formed on a p-type single crystal silicon substrate, and the polysilicon pattern thus formed is used as a gate electrode. Thermal oxidation is then performed to form a thick oxide film around the gate electrode and a thin oxide film on the exposed surface of the substrate. This is achieved because the oxidation rate of the phosphorus-doped polysilicon is greater than that of single crystal silicon. Thereafter, the oxide films are etched. The thin oxide film on the surface (source and drain) of the substrate is etched to expose the surface of the substrate, but the thick oxide film around the gate electrode partially remains. The exposed surface portion of the substrate is used as source and drain contact holes. The distances between the source and gate electrode and between the drain and gate electrode may therefore be minimized without requiring margins for positioning.

However, this SELCOS method has various problems to be described below.

The first problem is a low breakdown voltage of the thick oxide film around the gate electrode. In general, an oxide film which is obtained by etching has more enhanced defects and has greater characteristic variations than an epitaxially grown $SiO_2$ film. In particular, polysilicon doped with a high concentration of an impurity has a large crystal grain size and tends to have holes due to crystal interfaces or pinholes due to the photolithography process. For this reason, an oxide film obtained by thermally oxidizing a gate electrode made of such polysilicon of a high impurity concentration has poor characteristics. When such an oxide film is etched, a breakdown voltage (gate breakdown voltage, and breakdown voltage between the gate and source or between the source and drain) may be lowered.

The second problem is an undesirable increase in the parasitic capacitance between the gate electrode and source or drain. This is attributed to the small thickness of the oxide film around the gate electrode, the small distance between the gate electrode and the source or drain electrodes, and the large opposing areas of these electrodes. Although this problem may be partially solved by circuit design or the like, this imposes further limitations on circuit design.

The third problem is variations in the characteristics (fluctuations in the threshold voltage Vth). The difference in the oxidation rate of polysilicon and single crystal silicon by wet oxidation is reversely proportional to the oxidation temperature. However, an oxide film formed by wet oxidation at a low temperature has poor characteristics. Furthermore, the above-mentioned difference in oxidation rate increases with an increase in the concentration of the impurity in polysilicon. However, if the polysilicon of the gate electrode has a high impurity concentration, the impurity in the polysilicon is activated and diffused into the oxide film formed on the exposed surface of the single crystal silicon substrate. The impurity is further diffused from the oxide film into the substrate, causing further variations in the threshold voltage Vth.

The fourth problem is as follows. When the oxide film around the gate electrode of polysilicon is made thicker for improved breakdown voltage, that is, when the thermal oxidation time is prolonged, the above-mentioned difference in the oxidation rate is reduced. Then, contact holes for source and drain may not be formed in self-alignment with the gate electrode.

The fifth problem is that when a thick oxide film is formed around the gate electrode of polysilicon, the gate electrode is narrowed. Especially when the gate electrode has a step portion, disconnection may be caused at such a step portion. This is because it is very difficult to control the oxidation conditions and optimal setting of the impurity concentration in the polysilicon. When the gate electrode is micronized, the narrow gate electrode results in an increase in resistance and thus impairs high-speed and high-performance operation of the MOS transistor.

The sixth problem is that micronization of a MOS transistor (semiconductor device) is limited since a positioning margin must be allowed between the source and drain electrodes. Since the source and drain electrodes overlap the oxide film on the gate electrode, a positioning marging (e.g., 1 to 2 $\mu$m) must be allowed between these electrodes if the electrodes are to be formed by photolithography. Therefore, if the MOS transistor is micronized, for example, with gate electrode width set to 1.0 $\mu$m, the source and drain electrodes cannot be formed with good precision unless the positioning margin is reduced to zero. However, it is practically impossible to reduce the margin to zero. Thus, although the SELCOS method is an excellent micronization technique which allows opening of contact holes in self-alignment with a gate electrode, it may not be effectively utilized. Furthermore, since the source and drain electrodes overlap the oxide film on the gate electrode, the parasitic capacitance increases between the overlapping portions of the gate electrode and the source and drain electrodes. This degrades performance of the MOS transistor.

Meanwhile, a method is proposed for forming a micronized gate electrode of a refractory metal silicide in the manufacture of a MOS transistor. Such a method is disclosed in Shinji Okazaki et al. "Edge-Defined Patterning of Hyperfine Refractory Metal Silicide MOS Structures" in IEEE TRANSACTION OF ELECTRON DEVICES, VOL. ED-28, NO-11, November 1981, pp. 1364 to 1368. In this method, as shown in FIGS. 1A to 1D, a vertical edge is formed on oxide film which is formed on a silicon substrate through. A gate material (e.g., MOSi$_2$) is deposited and covers the vertical edge. The gate material is selectively etched by anisotropic etching to leave the gate material on the vertical edge and to form a gate electrode having hyperfine dimensions (<¼ μm). The vertical edge is then etched, and the exposed oxide film is selectively etched. Thus, in accordance with this method, the gate material left on the vertical edge is used to form a gate electrode having hyperfine dimensions.

SUMMARY OF THE INVENTION

It is an object of the present invention to provide a method of manufacturing a semiconductor device, in which contact holes of impurity regions of a semiconductor body such as source and drain may be formed in self-alignment with a protruding pattern such as a gate electrode, and electrodes or wiring strips connected to the impurity regions through the contact holes can be formed in self-alignment with the protruding pattern (such as gate electrode), so that the semiconductor device may be micronized and may have high performance.

In order to achieve the above object, a method of manufacturing a semiconductor device according to the present invention comprises the steps of:

forming a thin film on a semiconductor body with a protruding pattern formed thereon;

with the thin film covering both the sides and the top of the protruding pattern;

performing a selective anisotropic etching on the thin film for a distance corresponding to the thin film thickness, thereby removing a portion of the thin film including that portion covering the top of the protuding pattern and leaving a portion of the thin film covering the sides of the protruding pattern, thus forming a thin film pattern surrounding at least a portion of the protruding pattern;

etching at least a top part of the protruding pattern while leaving the thin film pattern to extend upwardly from the surface of the semiconductor body;

forming a conductive material film covering the semiconductor body including the thin film pattern; and dividing the conductive material film into portions by removing the thin film pattern.

BRIEF DESCRIPTION OF THE DRAWINGS

FIGS. 1A to 1L are views showing steps of a method of manufacturing an n-channel MOS LSI according to Example 1 of the present invention, wherein FIGS. 1A to 1I and 1L are sectional views and FIGS. 1J and 1K are plan views;

FIG. 2 is a sectional view showing another step of the method of manufacturing an n-channel MOS LSI according to Example 1 of the present invention;

DETAILED DESCRIPTION OF THE PREFERRED EMBODIMENTS

Figure 1A:
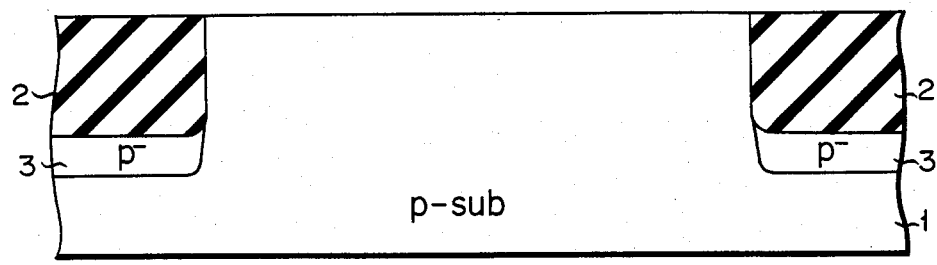

A protruding pattern is formed on a semiconductor body directly or through an insulation film. The semiconductor body may be a semiconductor substrate of a first conductivity type, a semiconductor substrate of the first conductivity type with an epitaxial layer formed thereon or an epitaxial layer formed on an insulated substrate (e.g., a sapphire substrate). The protruding pattern may be a two-layer pattern consisting of a semiconductor pattern and an insulation pattern laminated thereover, a two-layer pattern consisting of a conductor pattern and an insulation pattern laminated thereover or a single- or two-layer insulation pattern. The conductor pattern may consist of an impurity-doped polysilicon, an impurity-doped amorphous silicon, a refractory metal, a metal silicide, aluminum, an aluminum alloy or the like. The conductor pattern may be obtained by forming a film of a starting material of undoped polysilicon or undoped amorphous silicon, and doping it with an impurity of siliciding it. The starting material of the insulation pattern may be an epitaxial silicon oxide film, a PSG film or a silicon nitride film. If the present invention is applied to the manufacture of MIS (Metal Insulator Semiconductor) transistors, an impurity of a second conductivity type is introduced (e.g., ion-implanted) into a semiconductor body (e.g., semiconductor substrate of the first conductivity type), using the protruding pattern as a mask, so as to form impurity regions of the second conductivity type.

In the next step, a thin film is formed on the semiconductor body having a protruding pattern formed thereon, either directly or on top of a previously formed an insulation film. The thin film must allow selective etching of the portion of the protruding pattern which is etched by an etching process to be described later. Furthermore, if the thin film is formed on top of an insulation film, the thin film must also allow selective etching of the insulation film. The thin film may be a polysilicon film, an amorphous silicon film, a silicon nitride film, a polyimide resin film or the like.

The thin film is selectively etched by anisotropic etching (e.g., reactive ion etching, ion beam etching or the like), and the thin film pattern surrounding the sides of at least a portion the protruding pattern is left.

Next, at least the top part of the protruding pattern surrounded by the remaining thin fllm pattern is etched away. Then, the thin film pattern extends upwardly from the surface of the semiconductor body beyond the remaining portion, if any, of the protruding pattern. If the insulation film is formed, the top part of the insulation film is also etched. When impurity regions are formed in the semiconductor body in the manner as described above, the contact holes of the impurity regions are formed in self-alignment with the thin film pattern (or the protruding pattern).

Then, a conductive film (e.g., an electrode material film or a wiring material film) is deposited on the entire surface of the structure. The conductive film is made of a refractory material, a metal silicide, an aluminum, or an aluminum alloy. The conductive film may be easily divided by the thin film pattern. Thereafter, the thin film pattern is removed by etching so as to form electrodes or wiring strips between the now removed thin film pattern or around them if the thin film pattern is high and distances therebetween are small.

In this manner, according to the present invention, electrodes or wiring strips are formed after forming the thin film pattern. Therefore, electrodes or wiring strips may be formed between the thin film pattern as the thin film pattern serving as an isolation or division film for the electrodes or wiring strips. In conventional techniques, the electrode pitch or the like is determined by photolithography, limiting micronization of the electrode pattern or the like. In contrast to this, according to the method of the present invention, the electrode pitch or the like is determined by the thickness of the thin film, that is, the width of the thin film pattern formed by anisotropic etching and a top port of the protruding pattern is etched. Therefore, the electrodes or the wiring strips may be formed in the order of sub-microns, resulting in higher packaging density of elements.

In the thickness of the protruding pattern which determines the height of the remaining thin film pattern is increased, the height of the thin film pattern is not limited. As a result, by forming an electrode material film or the like after leaving a thin film pattern, the electrode film may be reliably isolated by the thin film pattern.

The higher the thin film pattern is, the easier it becomes to remove it by mechanical abrasion using by a jet scrubber or the like, in place of etching.

According to the present invention, a low-resistance electrode or wiring strip may be formed which allows easy patterning and which consists of a refractory material such as Mo, W, Ta or Pt which is hard to etch.

The present invention will now be described by ways of its examples with reference to the accompanying drawings.

EXAMPLE 1

In Example 1, the present invention is applied to the manufacture of an n-channel MOS LSI.

Figure 1B:
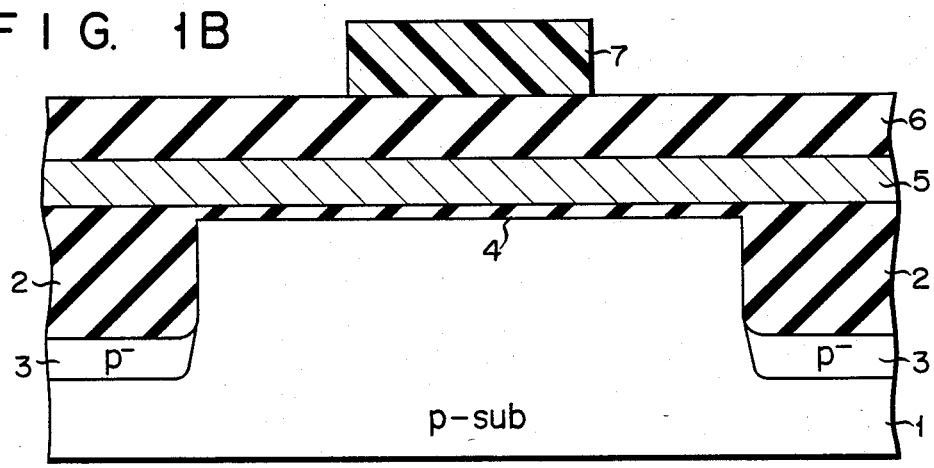
Figure 1C:
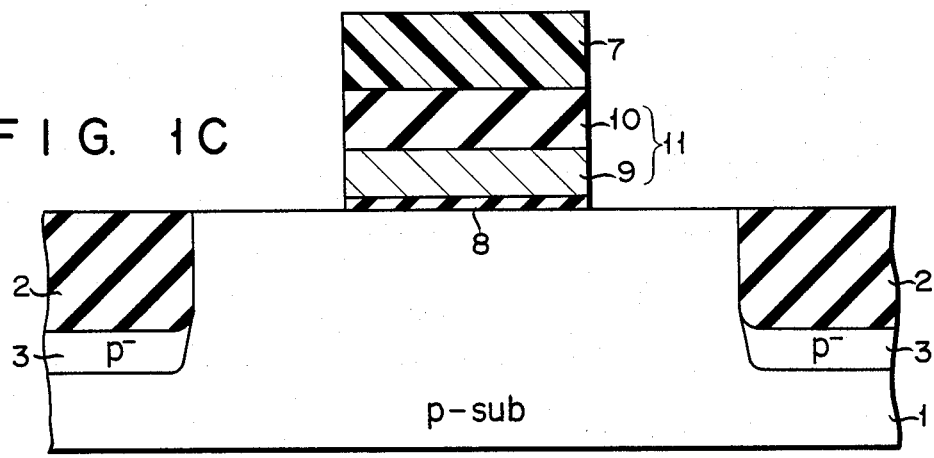

As shown in FIG. 1A, after selectively ion-implanting a p-type impurity such as boron into a p-type silicon substrate 1, selective oxidation was performed to form a field oxide film 2 and $p^-$-type channel cut region 3 in the vicinity of the bottom of the field oxide film 2. Subsequently, as shown in FIG. 1B, thermal oxidation was performed, thus forming a thermal oxide film 4 400 Å thick in an island-region of the silicon substrate 1 isolated by the field oxide film 2. Then, a phosphorus-doped polysilicon film 5 and a PSG film 6 each 500 Å were formed. Thereafter, a resist pattern 7 was formed on the prospective gate electrode formation region of the PSG film 6. In this step, a BSG film, an $SiO_2$ film or an $Si_3N_4$ film may be used in place of the PSG film. Then, as shown in FIG. 1C, the PSG film 6, the polysilicon film 5 and the thermal oxide film 4 were selectively removed by reactive ion etching (RIE) using the resist pattern 7 as a mask, thus forming a gate oxide film 8 and forming thereon a two-layer protruding pattern 11 consisting of a gate electrode 9 and a PSG pattern 10.

Figure 1D:
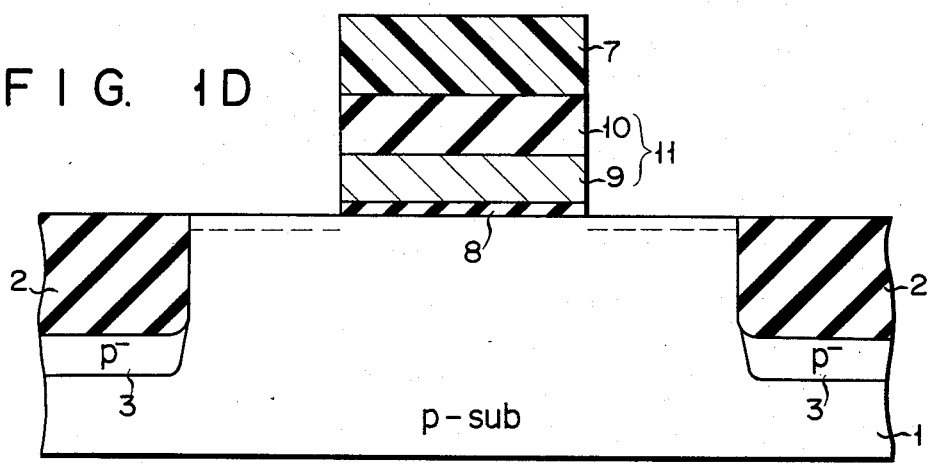
Figure 1E:
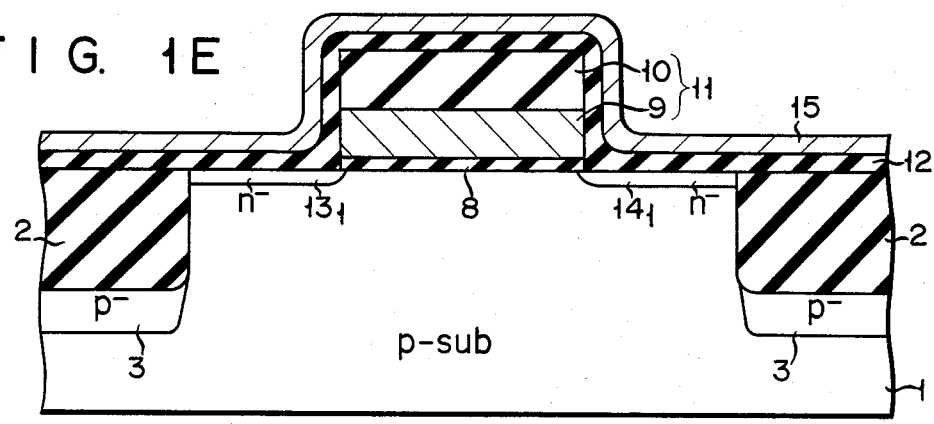

Then, as shown in FIG. 1D, using the resist pattern 7 as a mask, an n-type impurity, e.g., arsenic was ion-implanted into the silicon substrate 1. As shown in FIG. 1E, after removing the resist pattern 7, a thermal oxide film (not shown) of about 300 Å thickness was formed on the exposed surface of the silicon substrate 1 by thermal oxidation. As $SiO_2$ film 12 about 3,000 Å thick was formed by the chemical vapor deposition (CVD) method on the entire surface. Annealing was then performed at 900° C. to activate the ion-implanted arsenic to form shallow $n^-$-type regions $13_1$ and $14_1$ in the silicon substrate 1. Thereafter, a polysilicon film 15 4,000 Å thick was deposited on the entire surface by the CVD method. Even if the gate electrode 9 is made of undoped polysilicon, the polysilicon can be converted into a low-resistance phosphorus-doped polysilicon by diffusing phosphorus from the PSG pattern 10.

Figure 1F:
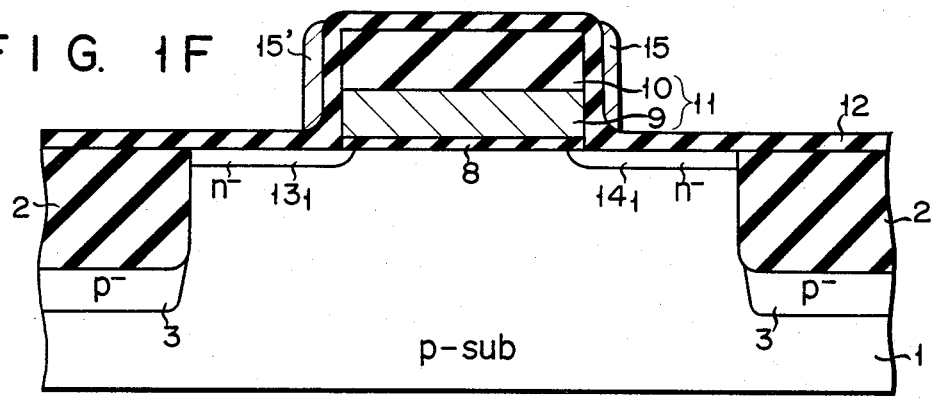

Subsequently, the polysilicon film 15 was etched by RIE for a distance corresponding to its thickness. Thus, as shown in FIG. 1F, a polysilicon film pattern 15' remained on the surface portion of the $SiO_2$ film 12 corresponding to the gate electrode 9 and the PSG pattern 10.

Figure 1G:
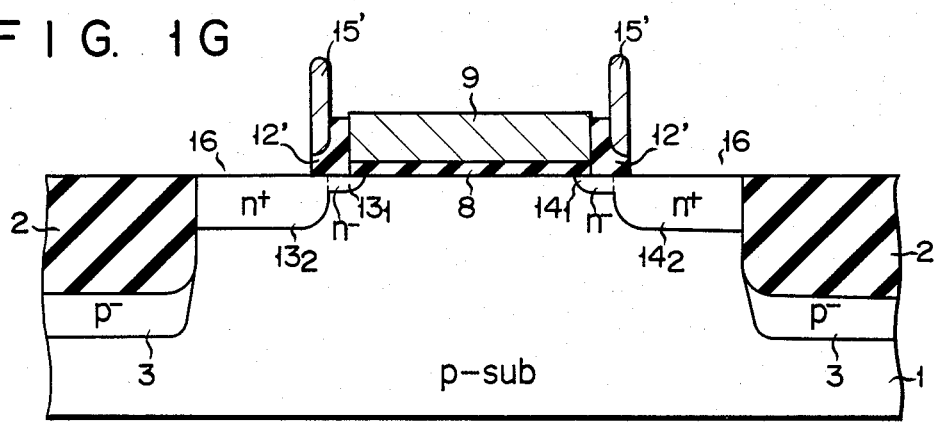

As shown in FIG. 1G, using the polysilicon film pattern 15' as a mask, the $SiO_2$ film 12 and the thermal oxide film (not shown) were etched by RIE for a distance corresponding to their total thickness, thereby forming contact holes 16 corresponding to the $n^-$-type regions $13_1$ and $14_1$ in self-alignment with the gate electrode 9. At the same time, an $SiO_2$ film pattern 12' remained between the polysilicon film pattern 15' and the gate electrode 9. Subsequently, the PSG pattern 10 of the protruding pattern 11 was etched away. Then, the pattern 15' upwardly protrudes from the gate electrode 9. Thereafter, using the gate electrode 9, the $SiO_2$ film pattern 12', the polysilicon film pattern 15' and the field oxide film 2 as a mask, an n-type impurity e.g., phosphorus was ion-implanted or doped in a $POCl_3$ atmosphere. Thus, $n^+$-type regions $13_2$ and $14_2$ were formed on the exposed portions of the $n^-$-type regions $13_1$ and $14_1$ which were exposed through the contact holes 16. The $n^+$-type regions $13_2$ and $14_2$ had a greater junction depth than the $n^-$-type regions $13_1$ and $14_1$ and had a high impurity concentration. The gate electrode 9 was doped with phosphorus to have a low resistance. The $n^-$-type region $13_1$ and the $n^+$-type region $13_2$ formed a source, and the $n^-$-type region $14_1$ and the $n^+$-type region $14_2$ formed a drain.

Figure 1H:
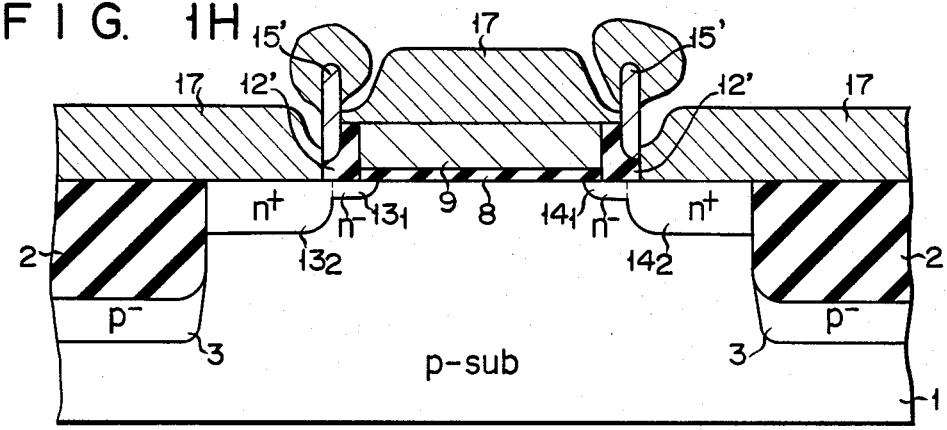
Figure 1I:
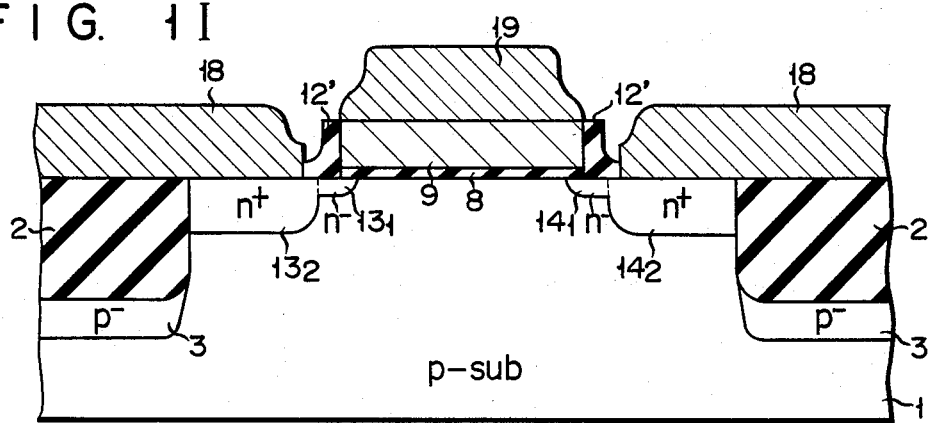

Then, as shown in FIG. 1H, an electrode film such as an Al film 17 was deposited on the entire surface. Then, the Al film 17 was divided by the polysilicon film pattern 15'. A very thin Al film was formed or was not formed around the polysilicon film pattern 15'. As shown in FIG. 1I, the polysilicon film pattern 15' was removed by isotropic dry etching, e.g., plasma etching. Thus, the Al film on the polysilicon film pattern 15' was lifted off to divide an Al pattern 19 which was formed on the gate electrode 9 and Al patterns 18 which was respectively connected through the contact holes 16 to the $n^-$-type region $13_1$ and the $n^+$-type region $13_2$ (source) and to the $n^-$-type region $14_1$ and the $n^+$-type region $14_2$ (drain). If a very thin Al film is deposited around the polysilicon film patter 15', the Al film can be etched for a short period of time to expose a part of the polysilicon film pattern 15'. Thereafter, the polysilicon film pattern 15' was removed by plasma etching or the like. The polysilicon film pattern 15' may alternatively be removed by mechanical abrasion using a jet scrubber or the like.

Figure 1J:
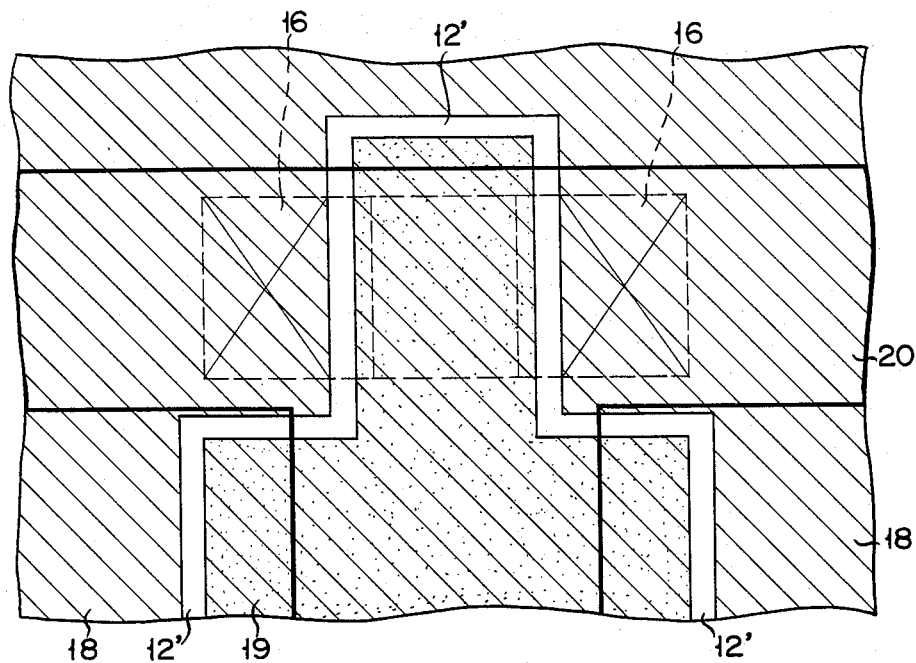
Figure 1K:
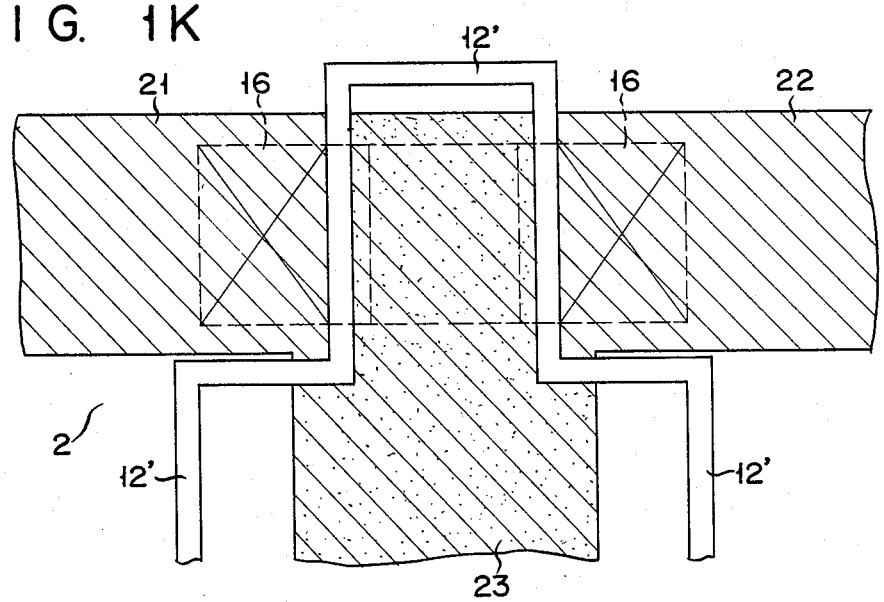

As shown in FIG. 1J, a resist pattern 20 was formed by photolithography on the Al patterns 18 and 19 which were isolated by the $SiO_2$ film pattern 12'. FIG. 1J is a plan view for easier understanding of the pattern. As shown in FIG. 1K (plan view), using the resist pattern 20 as a mask, the Al patterns 18 and 19 were selectively etched to form Al electrodes 21, 22 and 23 as source, drain and gate electrodes. The exposed portion of the gate electrode 9 was etched. The $SiO_2$ film pattern 12' for isolation of the Al electrodes 21 to 23 remained on the side surfaces of the gate electrodes 9. However, the SiO₂ film pattern 12' on the field oxide film 2 which does not serve to isolate the Al electrodes 21 to 23 may be removed by etching using the resist pattern 20 as a mask, or may be left on the field oxide film 2.

As shown in FIG. 1L, after removing the regist pattern 20, an SiO₂ film 24 was deposited on the entire surface to a thickness of 1.0 μm by the CVD method. A through hole 25 was formed on the portion of the SiO₂ film 24 on the Al electrode 21. An Al film was vacuum-deposited on the entire surface and was patterned to form Al wiring strips 26, thus completing a multilayered n-channel MOS LSI.

According to the present invention, the polysilicon film 15 is deposited on the protruding pattern 11 through the SiO₂ film 12. The polysilicon film 15 is etched by a distance corresponding to its thickness by RIE to form the polysilicon film pattern 15'. Using the polysilicon film pattern 15' as a mask, the SiO₂ film 12 and a thermal oxide film (not shown) are etched as well as the PSG pattern 10 as part of the protruding pattern 11. Thus, as shown in FIG. 1G, the contact holes 16 for the source and drain are formed, and the polysilicon film pattern 15' determines the distance between the contact holes 16 and the gate electrode 9. By etching the SiO₂ film 12 and the thermal oxide film (not shown) using the polysilicon film pattern 15' as a mask, a thin thermal oxide film (not shown) and the SiO₂ film pattern 12' of excellent insulating property may be formed around the gate electrode 9 and below the polysilicon film pattern 15'. Therefore, satisfactory passivation effect and an improved gate breakdown voltage may be obtained to allow manufacture of a high-performance MOS LSI of high packaging density.

Furthermore, unlike the conventional methods, a gate electrode of an impurity-doped polysilicon need not be oxidized to form a thick thermal oxide film on the side surfaces of the gate electrode, reduction in the width of the gate electrode may be prevented, and a MOS LSI having an initially designed threshold voltage Vth may be obtained. The oxidation time during the manufacture of an MOS LSI can be reduced since such a thick oxide film need not be formed. Therefore, rediffusion of the impurity in the n-type regions as the source and drain is suppressed, so that the junction depths of these regions (especially the N⁻-type regions 13₁ and 14₁) may be reduced to the minimum. In addition, rediffusion of the impurity in the p⁻-type channel cut region 3 may also be prevented.

As shown in FIG. 1L, according to the method of the present invention, since the Al electrode 23 of a low resistance can also be formed on the gate electrode 9 consisting of phosphorus-doped polysilicon, the gate electrode 9 may have a low resistance. As the gate electrode is micronized, the element characteristic is improved. However, the micronization in the gate electrode impairs the resistance increases and high-speed operation. Accordingly, in the method of the present invention, phosphorus-doped polysilicon is used to form the gate electrode 9. The Al electrode 23 may be formed on the gate electrode 9 as needed. Therefore, the Al electrodes 21 to 23 for the source, drain and gate all have low resistances. This results in a high-speed operation of the MOS LSI.

Furthermore, according to the method of the present invention, the contact holes 16 for the source (the n⁻-type region 13₁ and the n⁺-type region 13₂) and the drain (n⁻-type region 14₁ and the n⁺-type region 14₂) may be formed in self-alignment with the gate electrode 9. The Al electrodes 21 and 22 for the source and drain may also be formed in self-alignment with the gate electrode 9. With the conventional technique, the Al electrodes for the source and drain are formed to overlap the gate electrode even if the contact holes for the source and drain can be formed in self-alignment with the gate electrode. This is inevitable because the Al electrodes are formed and positioned by the photolithography. As a result, if the gate electrode is reduced in size to 1.5 μm, 1.0 μm or to the order of submicrons for improving the performance of the MOS LSI, Al electrodes for the source and drain cannot be formed by the conventional photolithography. Thus, with the conventional photolithography, the contact holes formed in self-alignment with the gate electrode cannot be used for micronization of the element. In contrast, in the method of the present invention, the polysilicon film pattern 15' can divide by self-alignment between the gate electrode 9 and the Al electrode 21 and between the gate electrode 9 and the Al electrode 22, as shown in FIG. 1H. The width of the polysilicon film pattern 15' is determined by the thickness of the polysilicon film 15 and can thus be controlled to a desired value. Moreover, processing in the order of submicrons may be performed between the gate electrode 9 and the Al electrode 21 and between the gate electrode 9 and the Al electrode 22, so that the width of the gate electrode 9 may be made in the order of submicrons. A micronized high-performance MOS LSI can thus be manufactured at a high yield.

As shown in FIG. 1D, in the method of the present invention, arsenic is ion-implanted in the silicon substrate 1 to form shallow n⁻-type regions 13₁ and 14₁ of low impurity concentration, using the protruding pattern 11 (resist pattern 7) and the field oxide film 2 as a mask. As shown in FIG. 1G, using the gate electrode 9, the SiO₂ film pattern 12', the fence-shaped polysilicon film pattern 15' and the field oxide film 2 as a mask, phosphorous or the like is ion-implanted into the n⁻-type regions 13₁ and 14₁ exposed through the contact holes 16 to form n⁺-type regions 13₂ and 14₂ having greater junction depth that of the n⁻-type regions 13₁ and 14₁ and having a high impurity concentration. With such steps, a source can be formed in which the n⁻-type region 13₁ is located near the gate electrode 9 and the n⁺-type region 13₂ is formed at a position far from the gate electrode 9 (corresponding to the contact hole 16). A drain having the n⁻-type region 14₁ and the n⁺-type region 14₂ having a similar positional relationship may also be formed. When a voltage is applied to the gate electrode 9 and the drain to operate the MOS transistor, punch-through phenomenon due to micronization (shortening of the channel region) of the gate electrode 9 or variations in the threshold voltage Vth may be prevented. Since the portions of the source and drain which are exposed through the contact holes 16 comprise the n⁺-type regions 13₂ and 14₂, the Al electrodes 21 and 22 may be formed to form ohmic contact with the source and drain.

Figure 3:
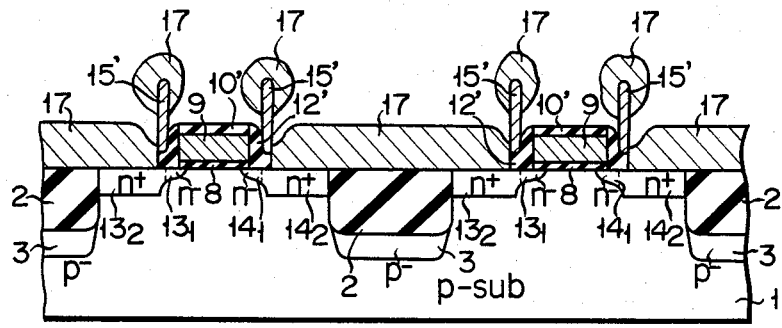
FIG. 3 is a sectional view showing another step of the method of manufacturing an n-channel MOS LSI according to Example 1 of the present invention.

In Example 1 described above, the PSG pattern 10 as part of the protruding pattern 11 is entirely etched so that the polysilicon film pattern 15' upwardly protrudes from the gate electrode 9. The Al electrode 23 is then formed on the gate electrode 9 by deposition and isolation of the Al film 17 so that the gate electrode 9 may have a low resistance. The method of the present invention is not limited to this. For example, as shown in FIG. 2, the PSG pattern 10 may be etched to leave a thin PSG pattern 10' on the gate electrode 9 as shown in FIG. 2 and a polysilicon film pattern 15' upwardly protrudes from the thin PSG pattern 10'. Then, the Al electrode 23 may be formed on the PSG pattern 10' by depositing an Al film on the polysilicon film pattern 15' and separating it. The Al electrode 23 may also be utilized as a wiring strip of another element. As shown in FIG. 3, a thick PSG pattern of 1.5 $\mu$m thickness is formed on the gate electrode 9 having dimensions of submicrons. Etching is performed, leaving the thick PSG pattern, and the polysilicon film pattern 15' upwardly protruding from the remaining PSG pattern 10'. Thereafter, the Al film 17 is deposited, so that no Al film may not be deposited on the PSG pattern 10' of the gate electrode 9 having dimensions in the order of submicrons by the blocking function of the polysilicon film pattern 15'. Referring to FIG. 3, if the portion of the gate electrode 9 consisting of $MoSi_2$ which extends over the field oxide film 2 has a great width, the Al film 17 is deposited on the PSG pattern 10' at this portion of the gate electrode 9. If the contact hole is formed in the portion of the PSG pattern 10' on the wide portion of the gate electrode 9, patterning of the Al film 17 will connect the Al electrode to the gate electrode 9 through the contact hole.

EXAMPLE 2

Example 2 is applied to the manufacture of a volatile memory cell of MNOS structure.

Figure 4A:
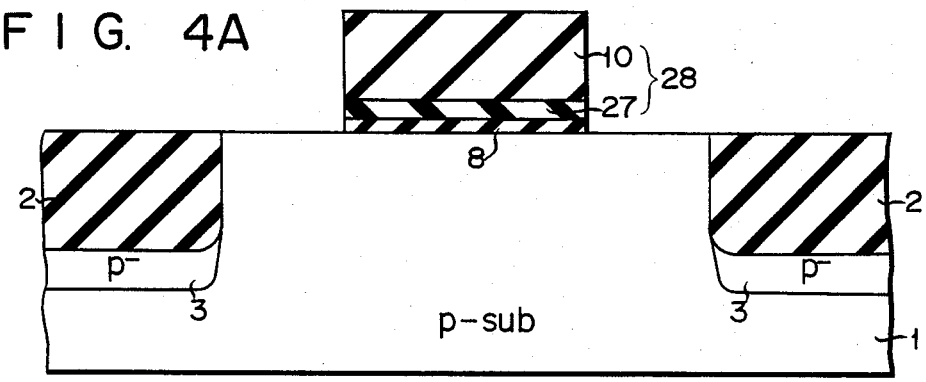
FIGS. 4A to 4G are sectional views sequentially showing steps of a method for manufacturing a memory cell of MNOS structure according to Example 2 of the present invention.

As shown in FIG. 4A, a field oxide film 2 was formed in a p-type silicon substrate 1 by the same procedure as in Example 1 described above. A $p^-$-type channel cut region 3 was formed in the portion of the substrate 1 which was in the vicinity of the field oxide film 2. Subsequently, oxidation was performed to grow a thermal oxide film of 30 Å thickness on the island-region of the substrate 1 isolated by the field oxide film 2. A silicon nitride film ($Si_3N_4$ film) of 500 Å thickness and a PSG film of 1.0 $\mu$m thickness were sequentially formed on the entire surface by the CVD method. Subsequently, a resist pattern (not shown) was formed on the PSG film by photolithography. Using the resist pattern as a mask, the underlying films were selectively etched to form a gate oxide film 8 and a two-layer protruding pattern 28 consisting of an $Si_3N_4$ pattern 27 and a PSG pattern 10 thereon.

Figure 4B:
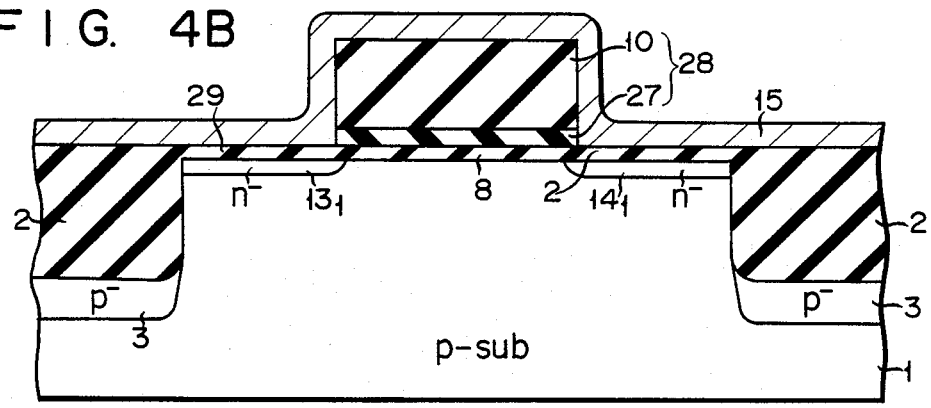

Then, as shown in FIG. 4B, using the resist pattern (not shown) and the field oxide film 2 as a mask, an n-type impurity, e.g., arsenic was ion-implanted into the silicon substrate 1. Thereafter, the resist pattern was removed, and annealing was then performed to form shallow and low concentration $n^-$-type regions $13_1$ and $14_1$. Subsequently, oxidation was performed to form a thermal oxide film 29 on the exposed surface of the substrate 1 ($n^-$-type regions $13_1$ and $14_1$), and a polysilicon film 15 of 5,000 Å thickness was deposited on the entire surface by the CVD method.

Figure 4C:
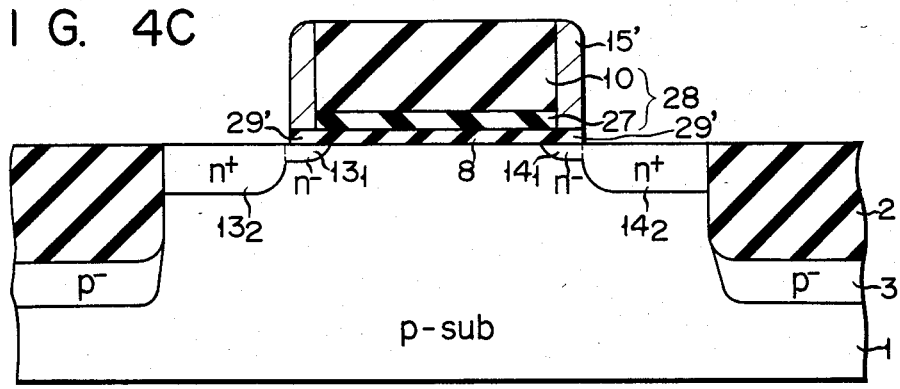

As shown in FIG. 4C, the polysilicon film 15 was etched by a distance corresponding to its thickness by RIE to leave a polysilicon film pattern 15' on the surface portion of the $Si_3N_4$ pattern 27 and the PSG pattern 10 (protruding pattern 28). Subsequently, using the polysilicon film pattern 15' as a mask, the thermal oxide film 29 was selectively etched to form contact holes 16 for the source and drain and to leave a thermal oxide film pattern 29' below the polysilicon film pattern 15'. Using the PSG pattern 10, the polysilicon film pattern 15', and the field oxide film 2 as a mask, an n-type impurity, e.g., phosphorus was ion-implanted or diffusion of $POCl_3$ was performed to form $n^+$-type regions $13_2$ and $14_2$ in the $n^-$-type regions $13_1$ and $14_1$. The $n^+$-type regions $13_2$ and $14_2$ had a greater junction depth than the $n^-$-type regions $13_1$ and $14_1$ and had a high impurity concentration. When the regions $13_2$ and $14_2$ were thus formed, a source consisting of the $n^-$-type region $13_1$ and the $n^+$-type region $13_2$ and a drain consisting of the $n^-$-type region $14_1$ and the $n^+$-type region $14_2$ were respectively formed.

Figure 4D:
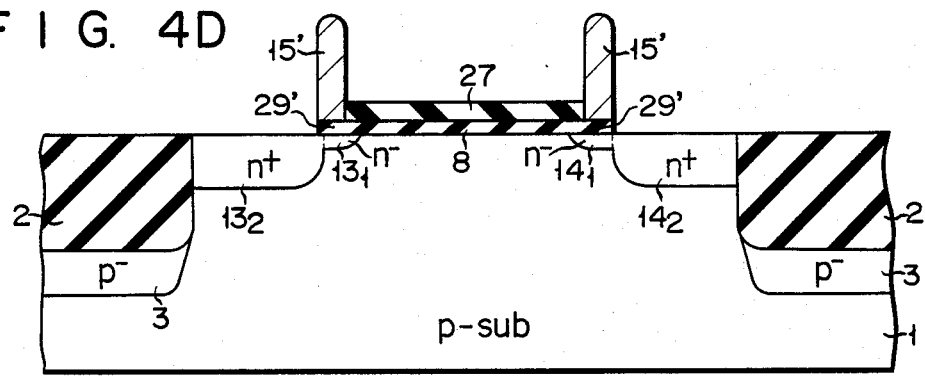

As shown in FIG. 4D, the PSG pattern 10 was entirely etched by a diluted hydrofluroic acid etching solution or a freon-type dry etchant. Then, the polysilicon film pattern 15' upwardly protruded from the $Si_3N_4$ pattern 27.

Figure 4E:
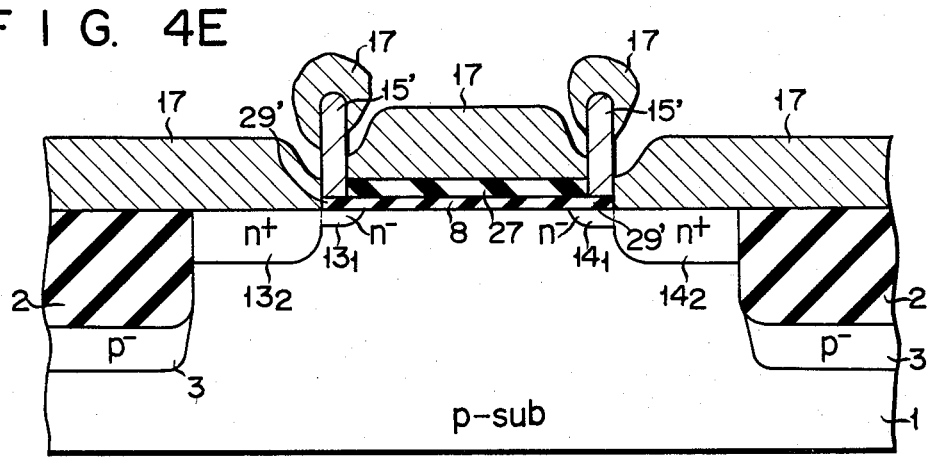

Then, an electrode material film such as an Al film 17 was deposited on the entire surface. As shown in FIG. 4E, the Al film 17 was disconnected at the polysilicon film pattern 15', and the Al film did not remain around the polysilicon film pattern 15'.

Figure 4F:
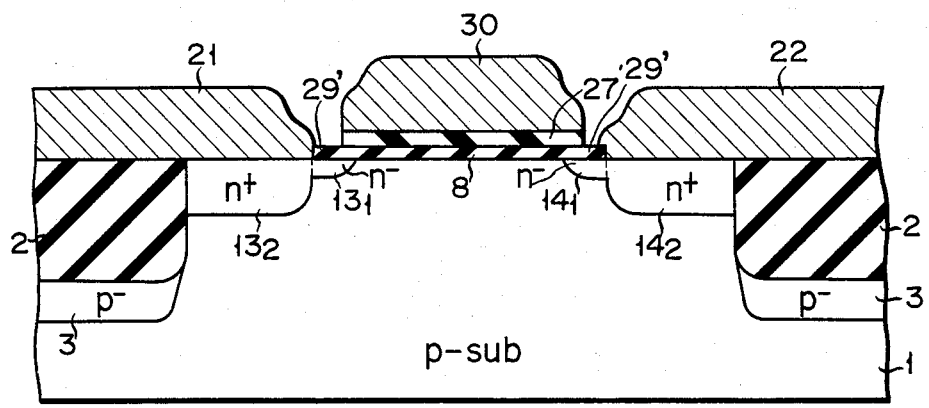

Then, as shown in FIG. 4F, the polysilicon film pattern 15' was etched by isotropic dry etching such as plasma etching to lift off the Al film formed thereover. The Al film 17 was thus separated. As in Example 1, using a resist pattern (not shown) as a mask, the isolated separated Al pattern was selectively etched. Thus, Al electrodes 21, 22 and 30 were formed. The Al electrode 21 connected the contact hole 16 and the source consisting of the $n^-$-type region $13_1$ and $n^+$-type region $13_2$. The Al electrode 22 connected the contact hole 16 and the drain consisting of the $n^-$-type region $14_1$ and the $n^+$-type region $14_2$. The Al gate electrode 30 was formed on the $Si_3N_4$ pattern 27.

Figure 4G:
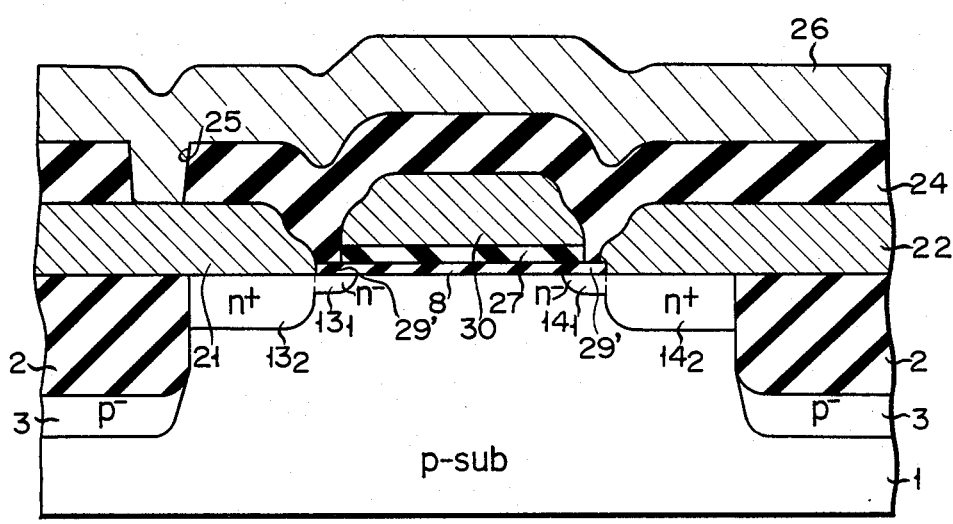

As shown in FIG. 4G, after removing the resist pattern, an $SiO_2$ film 24 1.0 $\mu$m thick was formed on the entire surface by the CVD method. A through hole 25 was formed in the portion of the $SiO_2$ film 24 corresponding to a part of the Al electrode 21. After forming another Al film by vacuum deposition, the Al film was patterned to form Al wiring strips 26, thus preparing a volatile memory cell of the MNOS structure.

According to this Example, a high-performance and high-packaging density volatile memory cell can be formed in which the Al electrode 21 for the source, the Al electrode 22 for the drain, and the Al electrode 30 for the gate can be formed in self-alignment, and the Al electrode 30 for the gate can be formed in the order of submicrons.

EXAMPLE 3

Example 3 is applied to formation of wiring strips which connect the elements of a semiconductor device.

Figure 5A:
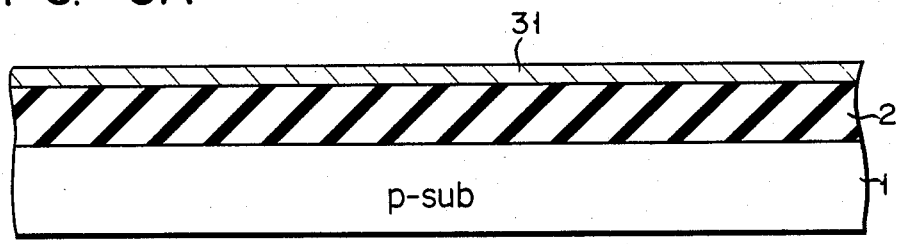
FIGS. 5A to 5H are sectional views sequentially showing steps of a method for forming wiring strips for a semiconductor device according to Example 3 of the present invention.
Figure 5B:
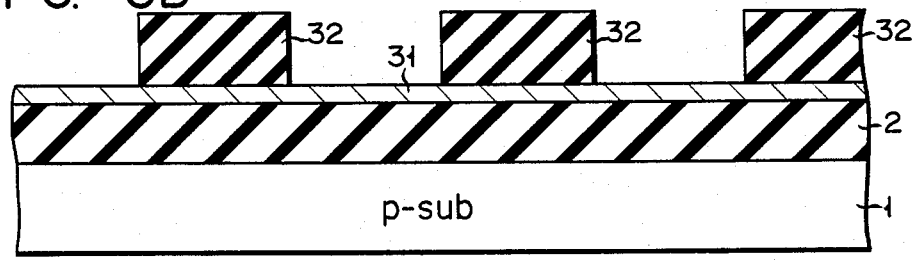

As shown in FIG. 5A, after selectively forming a field oxide film 2 on a p-type silicon substrate 1, a first phosphorus-doped polysilicon film 31 of 2,000 Å thickness was formed on the entire surface by the CVD method. Subsequently, after forming an $SiO_2$ film 1.0 $\mu$m thick on the entire surface by the CVD method, it was patterned to form $SiO_2$ patterns (protruding patterns) 32.

Figure 5C:
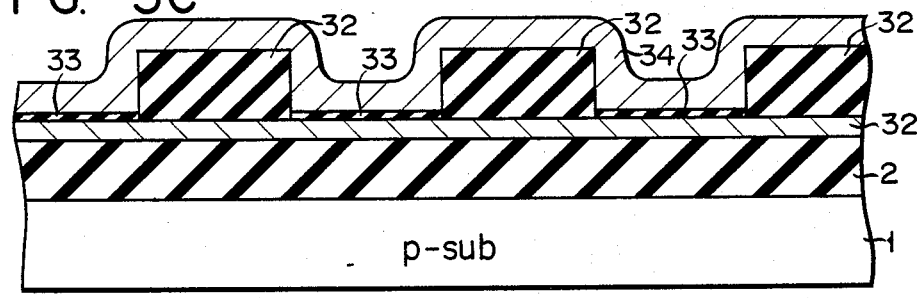
Figure 5D:
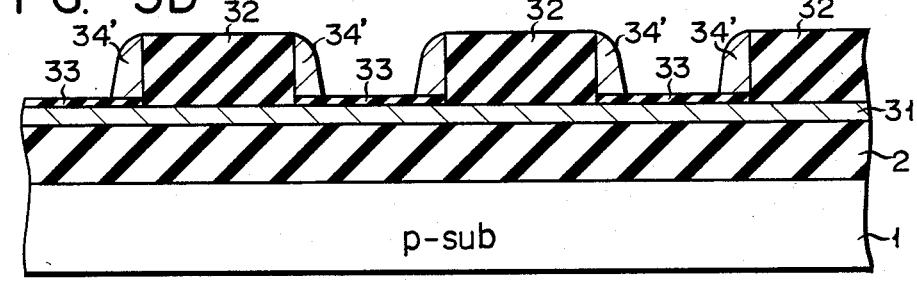

Then, as shown in FIG. 5C, thermal oxidation was performed to grow a thermal oxide film 33 on exposed the surface portion of the first phosphorus-doped polysilicon film 31. Thereafter, a second polysilicon film 34 was deposited to a thickness of 4,000 Å. Then, as shown in FIG. 5D, the second polysilicon film 34 was etched by RIE to leave a polysilicon film patterns 34' on the surface portion of the SiO₂ patterns 32.

Figure 5E:
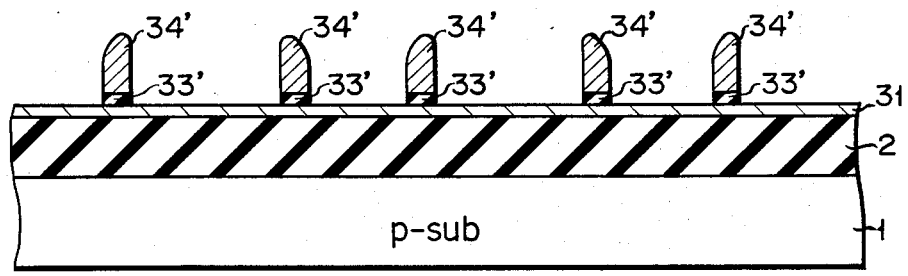

As shown in FIG. 5E, using the polysilicon film patterns 34' as a mask, the SiO₂ patterns 32 and the exposed portions of the thermal oxide film 33 were etched by RIE using a gas mixture of freon and hydrogen as an etchant. Thus, polysilicon film patterns 34' upwardly protruded from the first phosphorus-doped polysilicon film 31, and thermal oxide film patterns 33' remained below these polysilicon film patterns 34'.

Figure 5F:
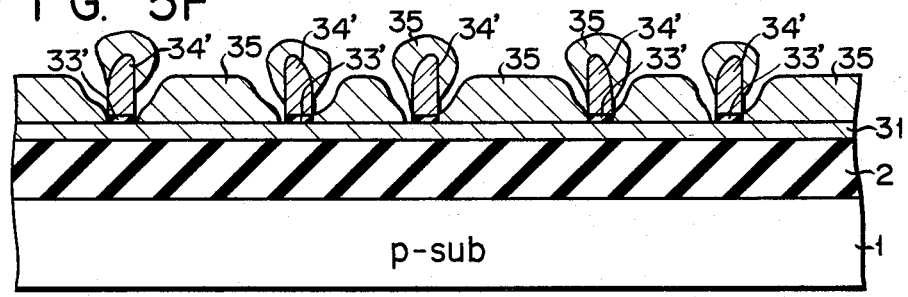
Figure 5G:
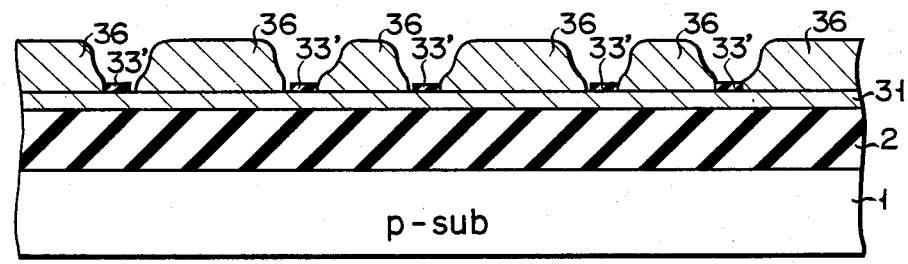
Figure 5H:
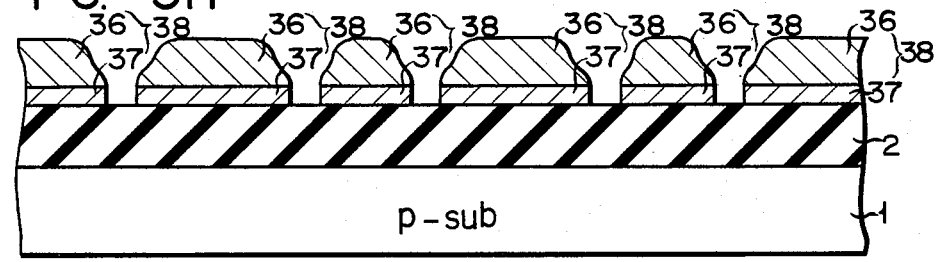

As shown in FIG. 5F, an Al film 35 as a wiring film was vacuum-deposited by E-gan vacuum deposition or S-gan vacuum deposition. At this time, the Al film 35 was divided at the polysilicon film patterns 34'. At the same time, the Al film did not remain at all or only remained to have a very small thickness around the polysilicon film patterns 34'. As shown in FIG. 5G, the polysilicon film patterns 34' were etched by dry etching using a freon-type etchant to lift off the Al film thereon and to form Al patterns 36. If the Al film of small thickness remained below the polysilicon film patterns 34', the Al film can be etched within a short period and then the polysilicon film patterns 34' can be etched. Subsequently, as shown in FIG. 5H, using the Al patterns 36 as a mask, the exposed thermal oxide film patterns 33' were etched by plasma etching using a gas mixture of freon and hydrogen as an etchant. Then, the exposed first phosphorus-doped polysilicon film 31 was selectively etched to form polysilicon patterns 37, thus manufacturing two-layer wiring strips 38 consisting of the Al patterns 36 and the polysilicon patterns 37.

In Example 3 described above, the two-layer wiring strips 38 can be easily formed which consists of the polysilicon patterns 37 and the Al patterns 36 which are separated by an extremely small distance which is determined by the width of the polysilicon film patterns 34'.

In Examples 1 to 3 described above, the polysilicon film patterns were etched to lift off the Al film formed thereover so as to isolate or pattern the Al film. However, the present invention is not limited to this. For example, the thin film patterns can be formed of an impurity-doped polysilicon. After depositing an undoped polysilicon film on the entire surface, thermal freatment is performed to selectively diffuse the impurity in the impurity-doped polysilicon film patterns to the surrounding undoped polysilicon film. Then, the impurity-doped portion of the undoped polysilicon film is etched to form wiring strips of polysilicon. Alternatively, the polysilicon thus obtained may be converted into a metal silicide to form wiring strips of low resistance. In this case, impurity is duffused from the impurity doped polysilicon film pattern to only that portion of the undoped polysilicon film which surrounds the protruding portion of the polysilion pattern. As a result, the wiring strips pitch can be made very small.

In Examples 1 to 3 described above, the protruding pattern was a two-layer pattern consisting of a gate electrode of phosphorus-doped polysilicon and a PSG pattern, a two-layer pattern consisting of an Si₃N₄ pattern and a PSG pattern, or an SiO₂ pattern. However, the protruding pattern may be a two-layer structure consisting of a semiconductor pattern and an insulation pattern. In this case, if the semiconductor pattern of the protruding pattern can be used as an emitter region of an npn bipolar transistor, electrode matrial film may be divided by thin film patterns formed on the surface of the semiconductor pattern. Thus, the base electrode and the emitter electrode may be isolated and may be formed with a high packaging density in self-alignment.

In summary, the present invention allows mass production of semiconductor devices such as MOS LSIs which have improved packaging density and performance.

What is claimed is:

1. A method of manufacturing a semiconductor device, comprising the steps of:
    forming a thin film on a semiconductor body on which a protruding pattern is formed, with said thin film covering both the sides and the top of said protruding pattern;
    performing a selective anisotropic etching on said thin film for a distance corresponding to said thin film thickness, thereby removing a portion of said thin film including that portion covering the top of said protruding pattern and leaving a portion of said thin film covering said sides of said protruding pattern, thus forming a thin film pattern surrounding at least a portion of the protruding pattern;
    etching at least a top part of the protruding pattern while leaving said thin film pattern to extend upwardly from the surface of said semiconductor body;
    forming a conductive film covering the semiconductor body including said thin film pattern; and
    dividing said conductive film into portions by removing said thin film pattern.

2. A method according to claim 1, wherein the protruding pattern comprises a two-layer structure consisting of a semiconductor pattern and an insulation pattern laminated thereover.

3. A method according to claim 1, wherein the protruding pattern comprises a two-layer structure consisting of a conductor pattern and an insulation pattern laminated thereover.

4. A method according to claim 3, wherein the conductor pattern consists of an impurity-doped polycrystalline silicon.

5. A method according to claim 3, wherein the conductor pattern consists of an impurity-doped amorphous silicon.

6. A method according to claim 3, wherein the conductor pattern consists of a refractory metal.

7. A method according to claim 3, wherein the conductor pattern consists of a metal silicide.

8. A method according to claim 3, wherein the conductor pattern consists of aluminum.

9. A method according to claim 3, wherein the conductor pattern consists of an aluminum alloy.

10. A method according to claim 3, wherein the conductor pattern comprises an impurity-doped polycrystalline silicon film which is formed using a polycrystalline silicon film as a starting material, and doping the polycrystalline silicon film with an impurity.

11. A method according to claim 3, wherein the conductor pattern comprises a metal silicide film which is formed using a polycrystalline silicon film as a starting material, and converting the polycrystalline silicon film into a metal silicide.

12. A method according to claim 3, wherein the conductor pattern comprises an impurity-doped amorphous silicon film which is formed using an amorphous silicon film as a starting material, and doping the amorphous silicon film with an impurity.

13. A method according to claim 3, wherein the conductor pattern comprises a metal silicide film which is formed by using an amorphous silicon film as a starting material and converting the amorphous silicon film into a metal silicide.

14. A method according to claim 2, wherein the insulation film is formed using an epitaxial PSG film as a starting material.

15. A method according to claim 2, wherein the insulation pattern is formed using an epitaxial silicon nitride film as a starting material.

16. A method according to claim 1, wherein the protruding pattern comprises a two-layer structure consisting of a silicon nitride pattern and a PSG pattern laminated thereover.

17. A method according to claim 1, wherein the protruding pattern comprises only an SiO$_2$ pattern.

18. A method according to claim 1, wherein the protruding pattern is formed directly on the semiconductor body.

19. A method according to claim 1, wherein the protruding pattern is formed on the semiconductor body through an insulation pattern.

20. A method according to claim 1, wherein the thin film is formed through an insulation film on said semiconductor body on which the protruding pattern is formed.

21. A method according to claim 1, wherein the thin film consists of polycrystalline silicon.

22. A method according to claim 1, wherein the thin film consists of amorphous silicon.

23. A method according to claim 1, wherein the thin film consists of silicon nitride.

24. A method according to claim 1, wherein the thin film consists of a polyimide resin.

25. A method according to claim 1, wherein said conductive film forms an electrode material.

26. A method according to claim 1, wherein said conductive film forms a wiring material.

* * * * *